United States Patent
Busch et al.

(10) Patent No.: US 9,507,391 B2
(45) Date of Patent: Nov. 29, 2016

(54) HEAT SINK WITH ORIENTABLE FINS

(75) Inventors: Diane S. Busch, Durham, NC (US); Michael S. June, Raleigh, NC (US); Chunjian Ni, Cary, NC (US); Pradeep Ramineni, Cary, NC (US)

(73) Assignee: Lenovo Enterprise Solutions (Singapore) Pte. Ltd., Singapore (SG)

( * ) Notice: Subject to any disclaimer, the term of this patent is extended or adjusted under 35 U.S.C. 154(b) by 574 days.

(21) Appl. No.: 13/305,177

(22) Filed: Nov. 28, 2011

(65) Prior Publication Data

US 2013/0138262 A1    May 30, 2013

(51) Int. Cl.
*G06F 1/20* (2006.01)
*H01L 23/34* (2006.01)
*H01L 23/467* (2006.01)

(52) U.S. Cl.
CPC .......... *G06F 1/20* (2013.01); *H01L 23/34* (2013.01); *H01L 23/467* (2013.01); *H01L 2924/0002* (2013.01)

(58) Field of Classification Search
None
See application file for complete search history.

(56) References Cited

U.S. PATENT DOCUMENTS

| | | | | |
|---|---|---|---|---|
| 3,721,421 A | * | 3/1973 | Cliff | 251/11 |
| 3,773,106 A | * | 11/1973 | Levy | 165/299 |
| 3,852,803 A | * | 12/1974 | Walmet et al. | 257/715 |
| 5,335,143 A | | 8/1994 | Maling, Jr. et al. | |
| 5,357,404 A | * | 10/1994 | Bright et al. | 361/818 |
| 5,671,120 A | * | 9/1997 | Kikinisi | 361/679.41 |
| 5,990,418 A | * | 11/1999 | Bivona et al. | 174/546 |
| 6,058,013 A | * | 5/2000 | Christopher et al. | 361/704 |
| 6,166,906 A | * | 12/2000 | Sun et al. | 361/697 |
| 6,648,064 B1 | * | 11/2003 | Hanson | 165/120 |
| 7,027,299 B2 | * | 4/2006 | Wrycraft et al. | 361/695 |
| 7,136,285 B1 | * | 11/2006 | Herbert | F04D 29/281 165/121 |
| 7,336,487 B1 | * | 2/2008 | Chrysler | H01L 23/473 62/3.2 |
| 7,397,664 B2 | * | 7/2008 | Ankireddi | 361/710 |
| 7,745,762 B2 | * | 6/2010 | Timans | 219/390 |

(Continued)

FOREIGN PATENT DOCUMENTS

| CA | CN 1732566 A | * | 2/2006 | H01L 23/4006 |
|---|---|---|---|---|
| CN | 2594987 Y | * | 12/2003 | |

(Continued)

OTHER PUBLICATIONS

Fellet, M., "One Per Cent: Spinning Heat Sink Could Lead to Faster Computers", Jul. 12, 2011, New Scientist.*

(Continued)

*Primary Examiner* — Mohammad Ali
*Assistant Examiner* — Kelvin Booker
(74) *Attorney, Agent, or Firm* — Katherine S. Brown; Jeffrey L. Streets

(57) ABSTRACT

A heat sink comprises a plurality of fins that may be positioned in a plurality of orientations relative to a heat-generating electronic component to which the heat sink is thermally coupled. A controller may be used to detect an elevated processor temperature and to activate a drive member to automatically adjust the orientation of fins on the heat sink. The fins may be moved and aligned with an air flow made over the heat sink. The adjustable-fin heat sink affords added flexibility in arranging a processor or other heat-generating electronic component on a circuit board. The orientation or position of the heat sink fins may also be automatically changed in response to a change in the air flow direction as manifested by a rise in the temperature of the heat sink or the heat-generating member.

14 Claims, 3 Drawing Sheets

(56) References Cited

U.S. PATENT DOCUMENTS

| | | | | |
|---|---|---|---|---|
| 8,003,370 | B2* | 8/2011 | Maltezos et al. | 435/283.1 |
| 8,072,761 | B2* | 12/2011 | Thomsen et al. | 361/719 |
| 8,144,460 | B2* | 3/2012 | Luo et al. | 361/679.47 |
| 8,513,842 | B2* | 8/2013 | Iwasaki et al. | 310/64 |
| 8,706,315 | B2* | 4/2014 | Sato | 700/300 |
| 2002/0100577 | A1* | 8/2002 | Wagner | 165/80.3 |
| 2003/0184972 | A1* | 10/2003 | Saeki | G06F 1/20 361/698 |
| 2004/0095728 | A1* | 5/2004 | Bird et al. | 361/704 |
| 2004/0114327 | A1 | 6/2004 | Sri-Jayantha et al. | |
| 2005/0041391 | A1* | 2/2005 | Wrycraft et al. | 361/695 |
| 2005/0067152 | A1* | 3/2005 | Huang | H01L 23/467 165/122 |
| 2005/0168702 | A1* | 8/2005 | Koegler et al. | 353/52 |
| 2005/0254208 | A1* | 11/2005 | Belady et al. | 361/690 |
| 2005/0286221 | A1* | 12/2005 | Yamana et al. | 361/687 |
| 2006/0042291 | A1* | 3/2006 | Petroski | G06F 1/20 62/264 |
| 2006/0095796 | A1* | 5/2006 | Chotoku | G06F 1/206 713/300 |
| 2007/0042514 | A1* | 2/2007 | Wu | G06F 1/183 438/17 |
| 2007/0256813 | A1* | 11/2007 | Ho | 165/80.3 |
| 2007/0268673 | A1* | 11/2007 | Ankireddi | 361/710 |
| 2007/0284079 | A1* | 12/2007 | Sun | H01L 23/467 165/80.3 |
| 2007/0296071 | A1 | 12/2007 | Chiu et al. | |
| 2008/0041561 | A1* | 2/2008 | Zhou et al. | 165/80.3 |
| 2008/0123297 | A1* | 5/2008 | Tilton et al. | 361/700 |
| 2008/0163508 | A1* | 7/2008 | Zhang | G01B 7/30 33/534 |
| 2008/0174952 | A1 | 7/2008 | Ye et al. | |
| 2008/0178028 | A1* | 7/2008 | Edwards | 713/323 |
| 2008/0192427 | A1* | 8/2008 | Wu et al. | 361/687 |
| 2008/0199238 | A1* | 8/2008 | Sawai et al. | 400/120.01 |
| 2009/0046425 | A1* | 2/2009 | Kavanagh | H04N 9/3144 361/695 |
| 2009/0199997 | A1* | 8/2009 | Koplow | 165/80.3 |
| 2009/0205807 | A1 | 8/2009 | Kim et al. | |
| 2009/0211729 | A1* | 8/2009 | Wang | H01L 23/467 165/80.3 |
| 2009/0229796 | A1* | 9/2009 | Williams et al. | 165/121 |
| 2009/0229797 | A1* | 9/2009 | Williams et al. | 165/121 |
| 2009/0229798 | A1* | 9/2009 | Williams et al. | 165/121 |
| 2009/0244843 | A1* | 10/2009 | Hirohata et al. | 361/695 |
| 2009/0275014 | A1* | 11/2009 | Maltezos et al. | 435/5 |
| 2010/0129107 | A1* | 5/2010 | Takehara | G03G 21/206 399/92 |
| 2010/0172089 | A1* | 7/2010 | Chiu | G06F 1/20 361/679.47 |
| 2010/0177480 | A1* | 7/2010 | Koplow | 361/697 |
| 2010/0290195 | A1* | 11/2010 | Thomsen et al. | 361/720 |
| 2011/0073289 | A1* | 3/2011 | Shah | 165/122 |
| 2011/0103011 | A1* | 5/2011 | Koplow | 361/679.54 |
| 2011/0110035 | A1* | 5/2011 | Cheng | H01L 23/467 361/690 |
| 2011/0222236 | A1* | 9/2011 | Luo et al. | 361/679.47 |
| 2011/0247789 | A1* | 10/2011 | Yu | F04D 25/0613 165/121 |
| 2012/0085937 | A1* | 4/2012 | Coyle et al. | 250/492.3 |
| 2012/0175079 | A1* | 7/2012 | Chang | F04D 29/441 165/96 |
| 2012/0204577 | A1* | 8/2012 | Ludwig | F25B 21/04 62/3.3 |
| 2012/0314414 | A1* | 12/2012 | Flaherty | H05B 33/0803 362/249.02 |
| 2012/0320523 | A1* | 12/2012 | Murakami | G06F 1/20 361/679.54 |
| 2012/0327316 | A1* | 12/2012 | Okada et al. | 348/748 |
| 2013/0039752 | A1* | 2/2013 | Huang | G06F 1/203 415/206 |
| 2013/0105964 | A1* | 5/2013 | Seki | 257/712 |
| 2013/0327505 | A1* | 12/2013 | Gonzalez et al. | 165/104.26 |

FOREIGN PATENT DOCUMENTS

| | | | | |
|---|---|---|---|---|
| CN | 101114185 A | * | 1/2008 | H05K 7/20154 |
| CN | 101424965 A | * | 5/2009 | |
| CN | 101801165 A | * | 8/2010 | H05K 7/20736 |
| CN | 201780535 U | * | 3/2011 | |
| CN | 102143672 A | | 8/2011 | |
| CN | 102143672 B | * | 4/2013 | H05K 7/20145 |
| CN | 103135721 A | * | 6/2013 | G06F 1/20 |
| CN | 103781324 A | * | 5/2014 | |
| EP | 2175484 A1 | | 10/2008 | |
| JP | 2265186 | | 10/1990 | |
| JP | 621281 | | 1/1994 | |
| JP | 7169887 | | 7/1995 | |
| JP | 2004111655 A | * | 4/2004 | H05K 7/20 |
| JP | 2009295826 A | * | 12/2009 | |

OTHER PUBLICATIONS

Holahan, M.F., "Fins, Fans and Form: Volumetric Limits to Air-Side Heatsink Performance", Jun. 1-4, 2004, The Ninth Intersociety Conference on Thermal and Thermomechanical Phenomena in Electronic Systems, vol. 1, pp. 564-570.*

Kim, T.Y.; Kim, D.-K. and Kim, S.J., "Scroll Heat Sink: A Heat Sink with the Moving Fins Inserted Between the Cooling Fins", May 28-31, 2008, 11$^{th}$ Intersociety Conference on Thermal and Thermomechanical Phenomena in Electronic Systems.*

Koplow, J.P., "A Fundamentally New Approach to Air-Cooled Heat Exchangers", Jan. 2010, Sandia National Laboratories, SAND2010-0258.*

Kim, T.Y.; Kim, D.-K. and Kim, S.J., "Scroll Heat Sink: A Heat Sink with the Moving Fins Inserted Between the Cooling Fins", May 2008, 11$^{th}$ Intersociety Conference on Thermal and Thermomechanical Phenomena in Electronic Systems.*

Ozturk, E., "CFD Analyses of Heat Sinks for CPU Cooling with Fluent", Dec. 2004, Thesis for M.S. in Mechanical Engineering at Middle East Technical University.*

Larsen, A. and Whetstone, R., "Nano-Scale Convective Heat Transfer of Vertically Aligned Carbon Nanotube Arrays", 2010, Project for B.S. In Mechanical Engineering at Worcester Polytechnic Institute.*

Krueger, W.B. and Bar-Cohen, A., "Optimal Numerical Design of Forced Convection Heat Sinks", Jun. 2004, IEEE Transactions on Components and Packaging Technologies, vol. 27, No. 2.*

IPO, "IPO Search Report", Application GB1220532.4, www.ipo.gov.uk, May 1, 2013, 4 pages.

PN 123531, Chinese Office Action (100034)—201210470784.5, Dated Jul. 29, 2015, 5 pages.

PN 123531, Chinese Office Action (100034)—201210470784.5, Dated Jun. 6, 2016, 5 pages.

Jing Yu, "Zhongzi Law Office—Letter to Mr. Mingjie Chai" Jun. 12, 2016, O/R PN 123531, 1 page.

* cited by examiner

HEAT SINK WITH ORIENTABLE FINS

BACKGROUND

Field of the Invention

The present invention relates to heat sinks for removing heat from heat-generating electronic components used in computers.

Background of the Related Art

Computer systems require removal of heat from heat-generating electronic components such as processors. Heat-generating electronic components are generally coupled to a generally planar host card such as a circuit board having a series of electronic contacts along an edge to facilitate electronic engagement between the host card and a motherboard. Electrical current and data are routed to the heat-generating electronic component through the motherboard and through the electronic contacts on the circuit board. Heat generated by the electronic component may be transferred by conduction to a heat sink. A plurality of fins may be coupled to the heat sink to dissipate heat to surrounding air within the computer chassis. Air flow within the chassis may be provided by air movers such as fans installed within a computer chassis, a server rack or within a server room. Air movers are generally fixed and may be coupled to a controller to vary the speed of the air mover as needed to provide sufficient air flow to cool electronic components.

Fins on a heat sink efficiently dissipate heat to a surrounding air flow when the fins are generally aligned with the air flow. For this reason, air movers are generally positioned to draw air into an inlet end of a chassis, server rack or server room, and heat sinks are generally positioned within a chassis to align the fins with the anticipated air flow. However, the direction of air flow within a computer chassis, server rack or server room can change direction. For example, if a computer chassis or server rack has multiple air movers disposed in a row or array, the failure of one or more air movers will change the direction of air flow across heat sink fins disposed within the computer chassis or server rack. As a result, the efficiency of the heat sink will decrease due to the misalignment of the air flow across the fins of the heat sink. As another example, obstructions such as expansion cards, circuit boards or even articles inadvertently placed near an air inlet or outlet of the chassis or rack can disrupt and change the direction of air flow across a heat sink, thereby resulting in a dramatic loss of heat sink efficiency due to misaligned air flow across the fins.

BRIEF SUMMARY

One embodiment of the present invention provides a heat sink comprising a base having a first face to engage a heat-generating electronic device and a second face, a rotary member having a first face to support a plurality of fins and a second face to engage the second face of the base, wherein the rotary member is rotatably received on the base, and a drive member coupled to the rotary member to rotate the rotary member relative to the base in response to a control signal.

Another embodiment of the invention provides a computer program product including computer usable program code embodied on a computer usable storage medium, the computer program product comprising a computer usable program code for receiving a signal from a temperature sensor coupled to a heat sink, and computer usable program code for activating a drive member to rotate a rotary member of the heat sink to minimize the temperature of heat sink, wherein the minimum temperature of the heat sink is minimized in response to aligning fins on the rotary member of the heat sink with air flow across the heat sink.

DETAILED DESCRIPTION

Figure 1:
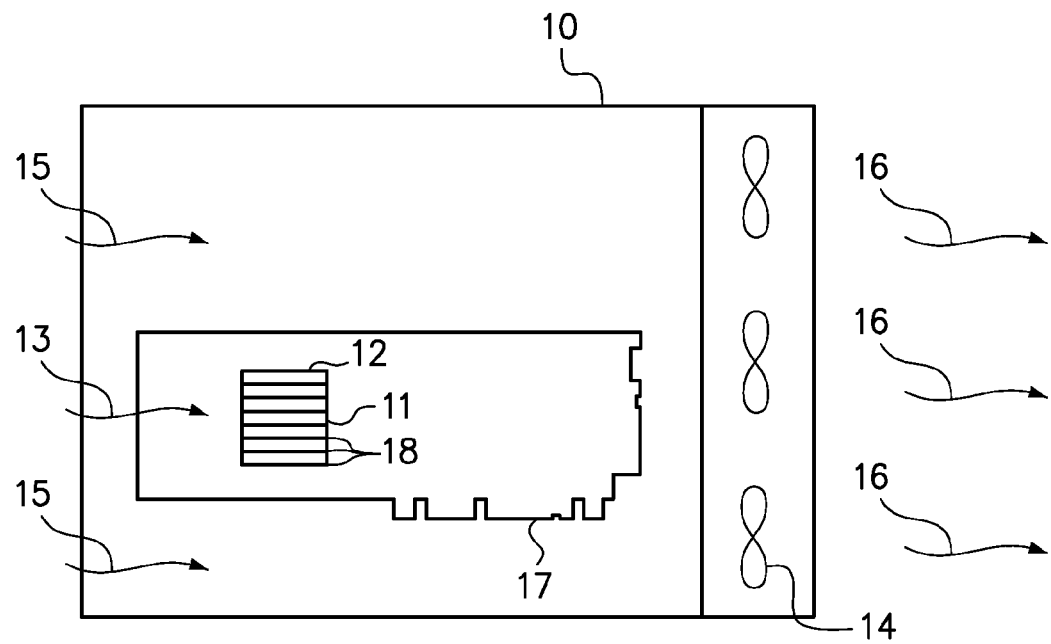
FIG. 1 is a plan view of a circuit board disposed within a computer chassis to support a processor coupled to an embodiment of a heat sink of the present invention with a plurality of orientable fins aligned with an air flow drawn through the computer chassis by a set of fans.

One embodiment of the present invention provides a heat sink having a drive member, a base and a rotary member to support a plurality of air-cooled fins. The rotary member is rotatably disposed on the base adapted to engage a heat-generating electronic device, such as a processor, disposed within a computer chassis. The drive member may be activated to rotate the rotary member to align the fins with an air flow within the computer chassis to remove heat generated by the processor by way of dissipation from the fins.

Embodiments of the heat sink may further comprise a temperature sensor coupled to at least one of the base and the rotary member to generate a signal corresponding to the temperature of the base or the rotary member. The temperature signal is communicated to a controller that activates the drive member to rotate the rotary member and thereby align the fins on the rotary member with an air flow within the chassis.

Alternate embodiments of the heat sink comprise a drive member activatable by a controller that receives a signal from a temperature sensor disposed on, in or adjacent to the heat-generating electronic device. For example, the temperature sensor may be included within a chip package having one or more processors. The signal from the temperature sensor to the controller corresponds to the temperature of the heat-generating electronic device. Activation of the drive member rotates the rotary member to align the fins with an air flow through the computer chassis to improve heat-dissipation capacity of the heat sink.

Embodiments of the heat sink may comprise a thermally conductive material disposed intermediate the base and the rotary member to promote conductive heat transfer from the base to the rotary member for dissipation of heat from the fins. The thermally conductive material may further provide lubrication to promote smooth rotation of the rotary member on the base. The thermally conductive material may comprise, for example, liquid metal or thermal grease.

Embodiments of the heat sink may comprise a gear disposed on the rotary member to engage a drive gear on a drive member coupled to the base, the processor, the circuit board on which the processor is secured or to the chassis. The drive member, upon activation, rotates the drive gear to counter-rotate the rotary member on the base to align the fins thereon with an air flow within the computer chassis. A low-conductivity bracket may be used to limit heat-transfer from the base or processor to the drive motor. A low-conductivity bracket may comprise an insulating material, such as ceramic, or it may comprise a thin-walled member having a very small cross-section to limit heat transfer.

Alternate embodiments of the heat sink may comprise a drive member coupled to the rotary member to rotate a drive gear that engages a stationary gear disposed on the base. The reaction force applied to the rotary member through the drive motor and bracket cause the rotary member to rotate relative to the base to align the fins on the rotary member with an air flow within the computer chassis.

A computer program product according to one embodiment of the invention includes computer usable program code embodied on a computer usable storage medium, where the computer program product comprises computer usable program code for receiving a signal from a temperature sensor coupled to a heat sink, and computer usable program code for activating a drive member to rotate a rotary member of the heat sink to minimize the temperature of heat sink. The temperature of the heat sink is minimized in response to aligning fins on the rotary member of the heat sink with air flow across the heat sink.

The computer program product may be executed by a controller, which may be a service processor such as a baseboard management controller (BMC) or an integrated management module (IMM). In a first option, the computer program product may further comprise computer usable program code for comparing the signal from the temperature sensor to a predetermined value; and computer usable program code for activating the drive member if the signal exceeds the predetermined value. According to this method, the rotary member remains stationary until a temperature deviation is detected.

In a second option, the computer program product may further comprise computer usable program code that determines a position or orientation of the rotary member and fins that produces the minimum heat sink temperature. Optionally, the temperature at each position of the rotary member and fins is measured which the heat-generating device is under a comparable workload. Where the heat-generating device is a processor, the workload of the processor may be controlled or at least monitored to assure that temperature differences between positions of the rotary member are not attributed to alignment/misaligned of the fins and airflow, when in fact the workload has changed.

The controller may periodically or continuously take steps to assure that the heat sink fins are aligned with the airflow. This type of methodology may be preferred in environments where the air flow direction is known to periodically change. In such an environment, the controller may periodically activate the drive member to rotate the rotary member and fins of the heat sink from a first position to a second position. At each position, the controller receives a signal from the temperature sensor. Then, the controller may compare the temperature of the heat sink at the first position to the temperature of the heat sink at the second position. The controller then determines which position resulted in a lower temperature. The lower temperature indicates that the rotary member is positioned so that the fins are aligned with the air flow, since heat transfer is most efficient in that position.

FIG. 1 is a plan view of a circuit board 17 disposed within a computer chassis 10 to support a processor 11 coupled to a heat sink 12 with a plurality of fins 18 aligned with air flowing in the direction indicated by the adjacent arrow 13. The cooling air is drawn through the chassis 10 by a set of air movers such as fans 14. The direction of the air flow within the chassis may vary from location to location depending on factors including proximity to the fans 14, fan speed and the proximity and size of obstructions. The direction of the air flowing within the computer chassis 10 in FIG. 1 is indicated by the arrows 13, 15 and the direction of air flowing outside of the computer chassis 10 is indicated by arrows 16. The direction of air flow indicated by the arrow 13 adjacent to the processor 11 and the adjacent arrows 15 to either side of the processor is generally congruent because the three fans 14 disposed within the chassis 10 are active, operating at approximately the same speed and generally uniformly spaced within the chassis 10.

Figure 2:
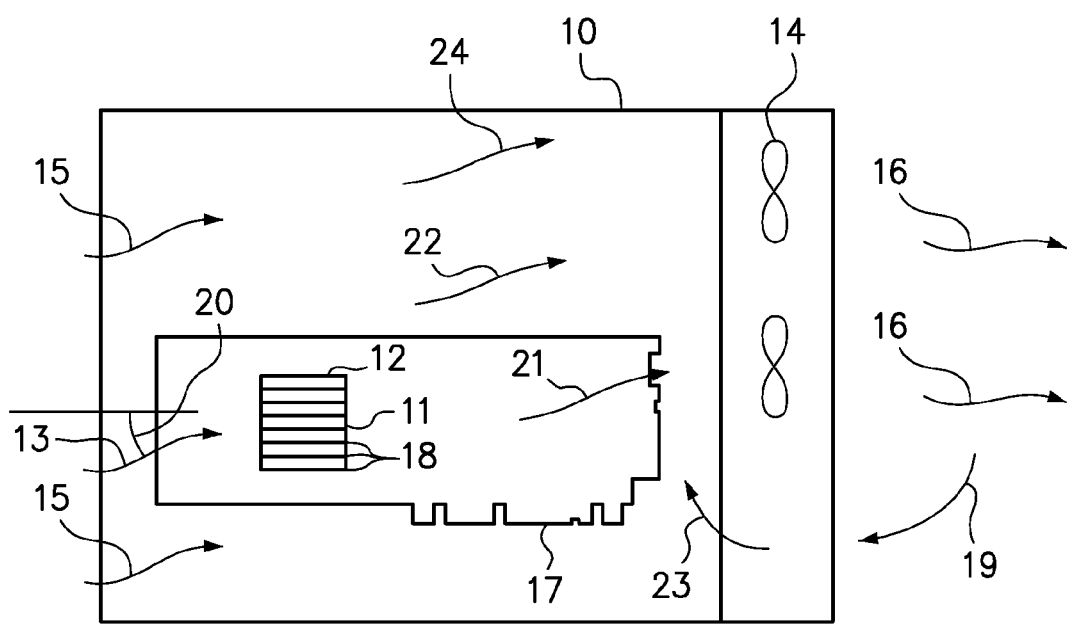
FIG. 2 is a plan view of the processor and an embodiment of a heat sink of FIG. 1 after the direction of the air flow through the computer chassis changes due to a fan failure.

FIG. 2 is the plan view of the processor 11 and heat sink 12 of FIG. 1 after the direction of the air flowing through the computer chassis 10 changes due to the failure of one of the three fans 14 illustrated in FIG. 1. The third (bottom) fan 14 from FIG. 1 is omitted from FIG. 2 to indicate two remaining operable fans 14. The direction of the air flowing within the chassis 10 changes as a result of the failure of the third fan (not shown in FIG. 2) and is in the directions as indicated by arrows 13, 15, 21, 22, 23, 24 within the chassis 10 and the directions of air flowing outside the chassis 10 is indicated by arrows 16, 19. The direction of the air flow within the chassis 10 immediately upstream (and to the left in FIG. 2) of the heat sink 12 is indicated by arrow 13, which it will be noted is no longer substantially aligned with the fins 18 on the heat sink 12. The direction of air flow indicated by the arrow 13 is instead flowing at an approach angle 20 of about 30 degrees at variance with alignment of the generally straight fins 18. It will be understood that air-cooled fins, such as straight fins, flared fins and fin structures comprising interconnected, repeating air channels, will suffer a substantial loss in heat-dissipating efficiency where the direction of the air flow across or through the fins is at a substantial variance with the linear orientation of the fins as illustrated in FIG. 2.

Figure 3:
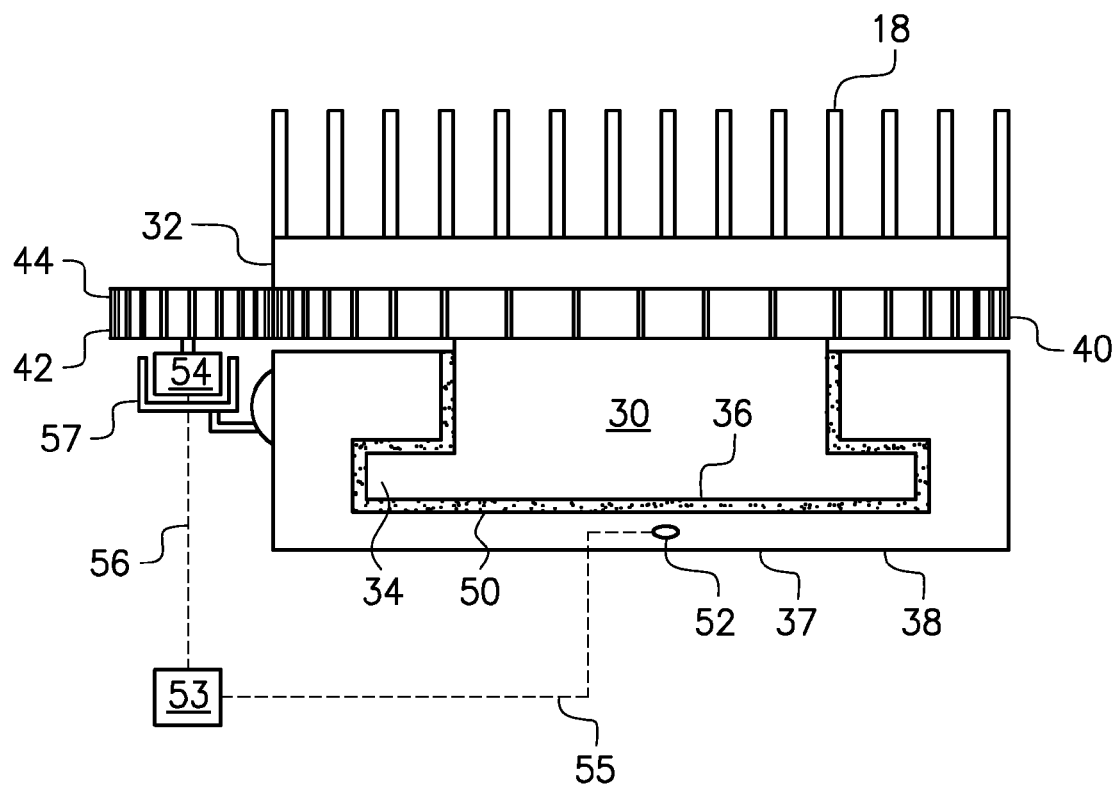
FIG. 3 is a section view of an embodiment of a heat sink having fins that may be adjusted to align with a changed air flow.

FIG. 3 is a section view of an embodiment of a heat sink 12 of the present invention having a plurality of straight fins 18 in a generally parallel configuration that may be adjusted to align with a direction of an air flow that is at variance with an original position of the fins 18. The embodiment of the heat sink 12 illustrated in FIG. 3 comprises a base 38, a rotary member 32 and a drive member 42. The rotary member 32 comprises a retainer 30 with a retainer flange 34, a gear 40 and a set of straight fins 18 extending in a generally parallel configuration. The retainer 30 is rotatably received against a first face 36 of the base 38 to couple the rotary member 32 to the base 38. A thermally conductive material 50, such as liquid metal or thermal grease, is disposed intermediate the retainer 30 and the base 38 to promote conductive heat transfer from the base 38 to the rotary member 32. The base 38 comprises a first face 37 to engage a heat-generating electronic component (not shown) such as a processor. The base 38 further comprises a temperature sensor 52 to generate a signal 55 corresponding to the temperature of the base 38 to a controller 53. The drive member 42 comprises a drive motor 54 coupled to a drive gear 44 positioned to engage and drive the gear 40 on the rotary member 32. The drive member 42 is coupled to the base 38 using an insulated drive member bracket 57 to minimize heat transfer from the base 38 to the drive member 42.

The controller 53, upon receiving a signal 55 indicating an excessive temperature in the base 38, generates an activating signal 56 to the drive motor 54 of the drive member 42. The drive motor 54 receives the activating signal 56 and rotates the drive gear 44 to counter-rotate the gear 40 on the rotary member 32 to re-align the fins 18 thereon.

Figure 4:
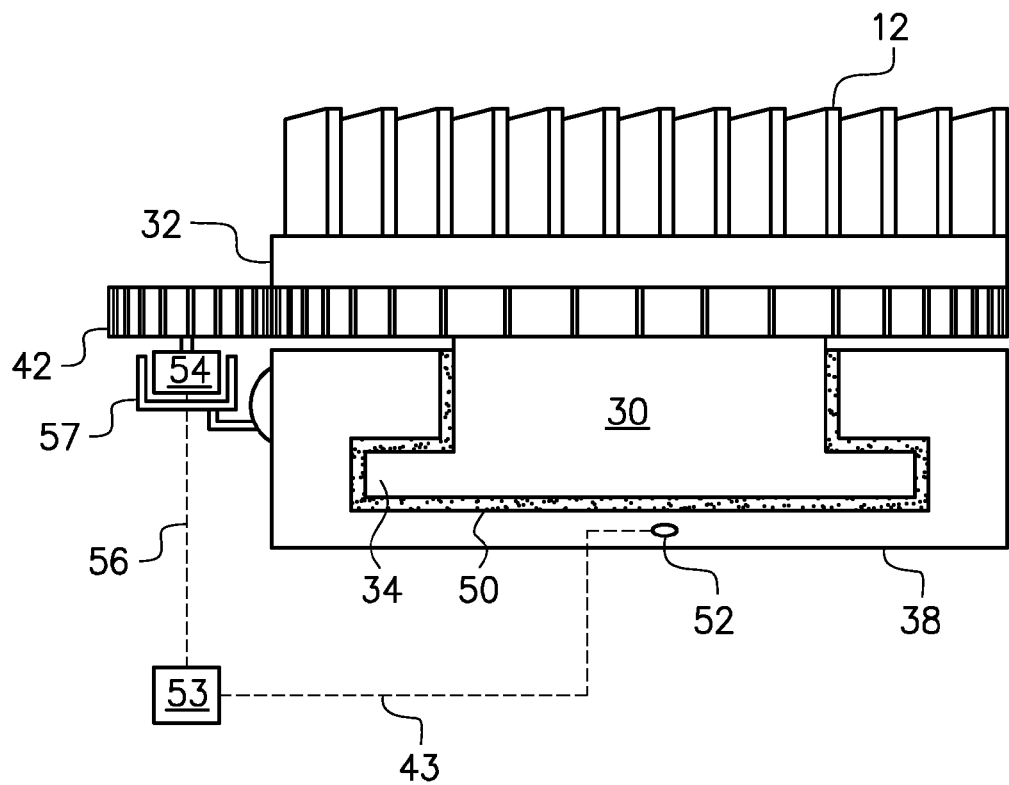
FIG. 4 is the section view of the heat sink of FIG. 3 after the fins are rotated to align with the changed air flow illustrated in FIG. 2.

FIG. 4 is the section view of the heat sink of FIG. 3 after the fins 18 and the rotary member 32 are rotated about 30 degrees counter-clockwise (if viewed from the plan view of FIG. 2) relative to the base 38 to align the fins 18 with the changed air flow (see arrow 13 in FIG. 2). The rotation of the retainer 30 on the rotary member 32 relative to the first face 36 of the base 38 does not impair conductive heat transfer from the base 38 to the fins 18 through the rotary member 32 because the thermally conductive material 50 continues to conduct heat from the base 38 to the rotary member 32. The drive member 42 may be deactivated after rotation of the rotary member 32 by a predetermined angle or by the use of the temperature sensor 52 to generate a second signal 43 to the controller 53 to discontinue the activating signal 56 (or, alternately, to send a deactivating signal 56) to the drive member 42.

Figure 5:
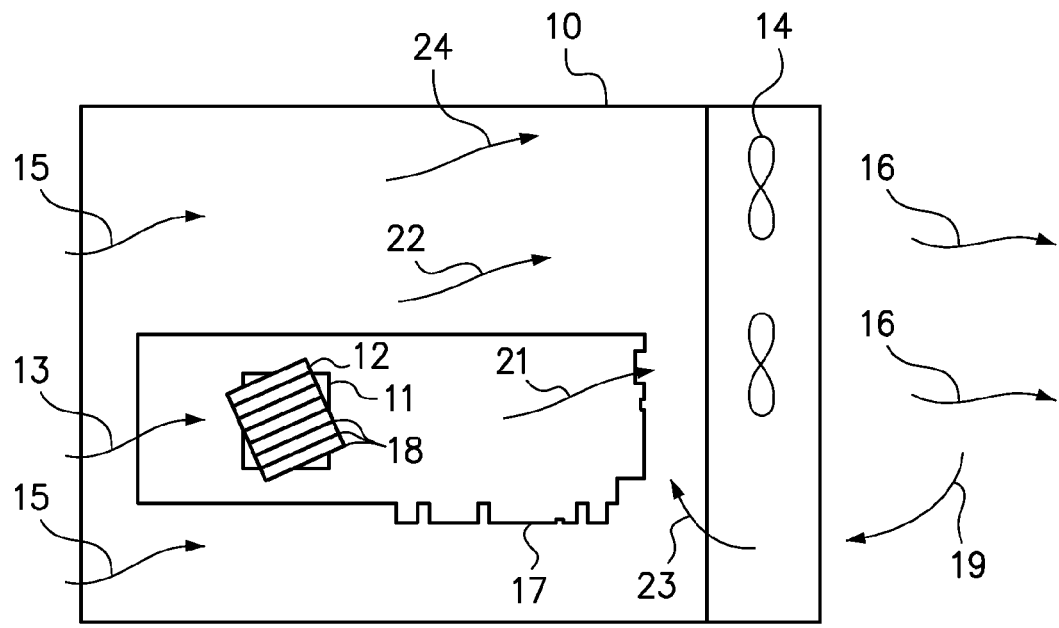
FIG. 5 is the plan view of FIG. 2 after the fins are rotated to align with the changed air flow as illustrated in FIG. 4.

FIG. 5 is the plan view of FIG. 2 after the fins 18 on the heat sink 12 are rotated into general alignment with the new direction of air flow indicated by the arrow 13. The direction of the air flow indicated by arrows 13, 15, 21, 22, 23, 24 within the chassis 10 and the direction of the air flow indicated by the arrows 16, 19, 28 outside the chassis 10 is generated by operation of the remaining two fans 14. It will be understood that the fans 14 may operate at an increased fan speed to compensate for the loss of the adjacent fan (omitted from FIG. 5—see FIG. 2). The actual directions of the air flow at various locations within and without the chassis 10 may vary with changes in the speed of the fans 14, the temperature and density of the air, the dimensions of the chassis 10 and obstructions, but the arrows illustrated on FIG. 5 illustrate a generally anticipated air flow pattern resulting from the operation of only two of the original three fans 14.

Figure 6:
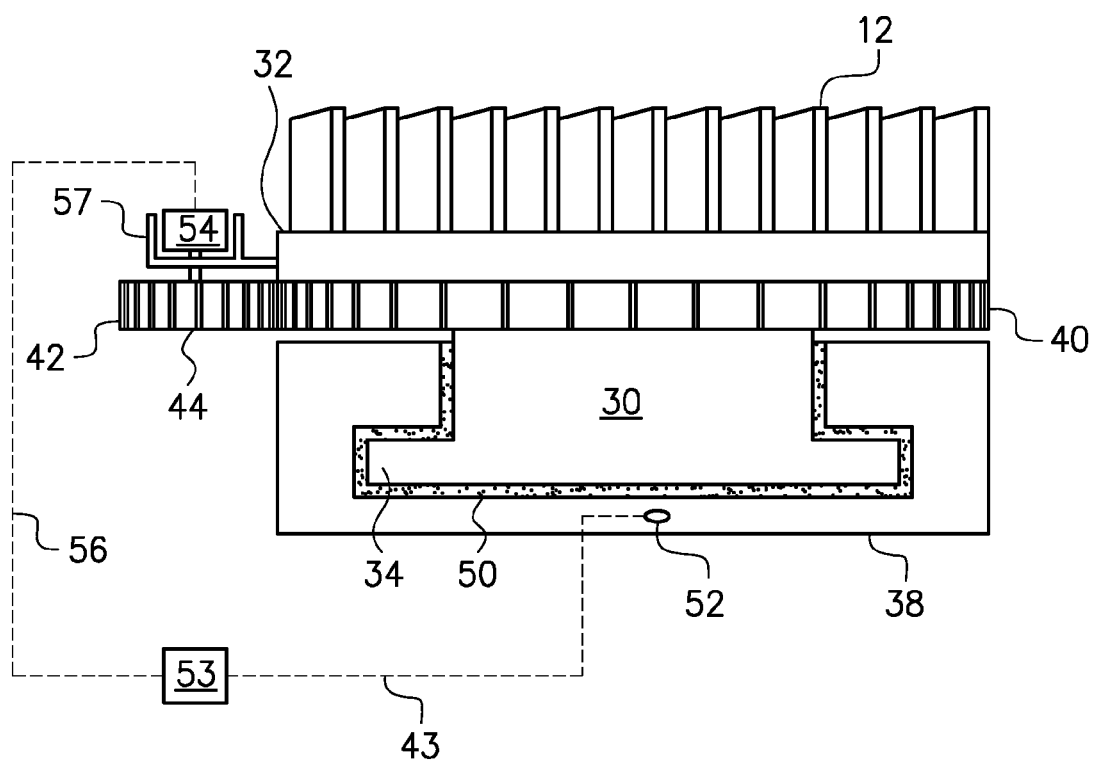
FIG. 6 is a section view of an alternate embodiment of a heat sink having fins that may be adjusted to align with a changed air flow.

FIG. 6 is a section view of an alternate embodiment of a heat sink having fins that may be adjusted to align with a changed air flow. The embodiment of the heat sink 12 illustrated in FIG. 6 also comprises a base 38, a rotary member 32 and a drive member 42. The rotary member 32 comprises a retainer 30 with a retainer flange 34 and a set of straight fins 18 extending in a generally parallel configuration. The retainer 30 is rotatably received against a first face 36 of the base 38 to couple the rotary member 32 to the base 38. A thermally conductive material 50, such as liquid metal or thermal grease, is disposed intermediate the retainer 30 and the base 38 to promote conductive heat transfer from the base 38 to the rotary member 32. The base 38 comprises a first face 37 to engage a heat-generating electronic component (not shown) such as a processor. The base 38 further comprises a gear 40, a temperature sensor 52 to generate a signal 55 corresponding to the temperature of the base 38 to a controller 53. The drive member 42 comprises a drive motor 54 coupled to a drive gear 44 positioned to engage the gear 40 on the rotary member 32. The drive member 42 is coupled to the rotary member 32 (instead of the base 38) using an insulated drive member bracket 57 to minimize heat transfer from the rotary member 32 to the drive member 42.

The controller 53, upon receiving a signal 55 indicating an excessive temperature in the base 38, generates an activating signal 56 to the drive motor 54 of the drive member 42. The drive motor 54 receives the activating signal 56 and rotates the drive gear 44 which engages the stationary gear 40 on the base 38. The reaction force within the motor 54, the bracket 57 and the rotary member 32 to the torque generated by the motor 54 and applied to the gear 40 causes the rotary member 32 to rotate to re-align the fins 18 thereon.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the invention.

The corresponding structures, materials, acts, and equivalents of all means or steps plus function elements in the claims below are intended to include any structure, material, or act for performing the function in combination with other claimed elements as specifically claimed. The description of the present invention has been presented for purposes of illustration and description, but it is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

What is claimed is:

1. A heat sink, comprising:
    a base having a first face to engage a heat-generating electronic device and a second face;
    a rotary member having a first face to support a plurality of fins in a generally parallel configuration and a second face to engage the second face of the base, wherein the rotary member is rotatably received on the base;
    a drive member coupled to the rotary member to rotate the rotary member relative to the base in response to a control signal; and
    a controller providing the control signal to align the plurality of fins with air flow across the heat sink.

2. The heat sink of claim 1, further comprising:
    a thermally conductive material disposed intermediate the face of the first base and the face of the second base to enhance heat transfer across the interface.

3. The heat sink of claim 2, wherein the thermally conductive material is at least one of thermal grease and liquid metal.

4. The heat sink of claim 1, wherein the rotary member has a gear to engage the drive member and the drive member is coupled to the computer chassis.

5. The heat sink of claim 1, wherein the drive member is coupled to the rotary member and the drive member has a gear that engages a gear coupled to the computer chassis.

6. The heat sink of claim 1, further comprising:
a temperature sensor coupled to the base.

7. The heat sink of claim 6, wherein the temperature sensor and the drive member are in electronic communication with the controller.

8. The heat sink of claim 7, wherein the controller generates the control signal to the drive member to minimize the temperature of the base.

9. The heat sink of claim 1, wherein the drive member is an electric motor.

10. The heat sink of claim 9, wherein the electric motor is powered by electric current provided from a circuit board to which the heat-generating electronic device is securable.

11. The heat sink of claim 1, wherein the base and the rotary member are circular.

12. A computer program product including computer usable program code embodied on a computer usable storage medium, wherein the computer usable program code is executable by a processor to cause the processor to perform various actions, the computer program product comprising:
 computer usable program code for receiving a signal from a temperature sensor coupled to a heat sink; and
 computer usable program code for activating a drive member to rotate a rotary member of the heat sink to minimize the temperature of heat sink, wherein the minimum temperature of the heat sink is minimized in response to aligning fins in a generally parallel configuration on the rotary member of the heat sink with air flow across the heat sink;
 the heat sink, comprising:
  a base having a first face to engage a heat-generating electronic device and a second face;
  a rotary member having a first face to support a plurality of fins in a generally parallel configuration and a second face to engage the second face of the base, wherein the rotary member is rotatably received on the base; and
  a drive member coupled to the rotary member to rotate the rotary member relative to the base in response to a control signal.

13. The computer program product of claim 12, further comprising:
 computer usable program code for comparing the signal from the temperature sensor to a predetermined value; and
 computer usable program code for activating the drive member if the signal exceeds the predetermined value.

14. The computer program product of claim 12, further comprising:
 computer usable program code for periodically activating the drive member to rotate the rotary member and fins of the heat sink from a first position to a second position;
 computer usable program code for receiving the signal from the temperature sensor at the first position and the second position;
 computer usable program code for comparing the heat sink temperature at the first position and the second position; and
 computer usable program code for rotating the rotary member to the position having the lowest temperature.

* * * * *